United States Patent [19]
Kashiwa et al.

[11] Patent Number: 5,302,554
[45] Date of Patent: Apr. 12, 1994

[54] METHOD FOR PRODUCING SEMICONDUCTOR DEVICE

[75] Inventors: Takuo Kashiwa; Takahide Ishikawa; Yoshihiro Notani, all of Itami, Japan

[73] Assignee: Mitsubishi Denki Kabushiki Kaisha, Tokyo, Japan

[21] Appl. No.: 928,026

[22] Filed: Aug. 11, 1992

[30] Foreign Application Priority Data

Feb. 6, 1992 [JP] Japan .................. 4-057152

[51] Int. Cl.⁵ .......................................... H01L 21/302
[52] U.S. Cl. ................................... 437/227; 437/226; 148/DIG. 28
[58] Field of Search ............. 437/226, 227, 225, 974; 148/DIG. 28, DIG. 135

[56] References Cited

U.S. PATENT DOCUMENTS

| | | | |
|---|---|---|---|
| 3,911,559 | 10/1975 | Bean et al. | 437/227 |
| 4,023,258 | 5/1977 | Carlson et al. | 437/227 |
| 4,904,610 | 2/1990 | Shyr | 437/227 |
| 4,946,716 | 8/1990 | Corrie | 437/227 |
| 4,978,639 | 12/1990 | Hua et al. | 437/226 |
| 5,071,792 | 12/1991 | Van Vonno et al. | 437/227 |
| 5,128,282 | 7/1992 | Ormond et al. | 437/227 |

FOREIGN PATENT DOCUMENTS

| | | |
|---|---|---|
| 3735489 | 10/1987 | Fed. Rep. of Germany . |
| 56-103447 | 8/1881 | Japan . |
| 0078827 | 4/1987 | Japan ................. 437/226 |
| 62-122279 | 6/1987 | Japan . |
| 63-276276 | 11/1988 | Japan . |
| 2148739 | 6/1990 | Japan . |
| 2214127 | 8/1990 | Japan . |

OTHER PUBLICATIONS

Chang et al., "A Hybrid Wafer-Dicing Process for GaAs MMIC Production", 8309 IEEE Transaction on Semiconductor Manufacturing 4 (1991) Feb., No. 1, New York, pp. 66-68.

*Primary Examiner*—Brian E. Hearn
*Assistant Examiner*—Tuan Nguyen
*Attorney, Agent, or Firm*—Leydig, Voit & Mayer

[57] ABSTRACT

According to a method for producing semiconductor chips, grooves serving as dicing lines are formed in a front surface of a semiconductor wafer, the semiconductor wafer is ground from the rear surface to a prescribed thickness, leaving portions of the wafer opposite the grooves, a feeding layer is formed on the ground rear surface of the wafer, a metal layer for heat radiation is formed on the feeding layer, a dicing tape is applied to the metal layer, and the wafer and the feeding layer are diced along the dicing lines, resulting in a plurality of semiconductor chips. Therefore, the strength of the wafer is increased because portions of the wafer remain at the dicing lines, preventing curvature of the wafer. When a plurality of metal layers for heat radiation are selectively formed on the feeding layer except for regions opposite the dicing lines, since only thin portions of the wafer and the feeding layer are present at the dicing lines, burrs produced during dicing are reduced and an adequate junction is achieved in a subsequent die-bonding process.

6 Claims, 7 Drawing Sheets

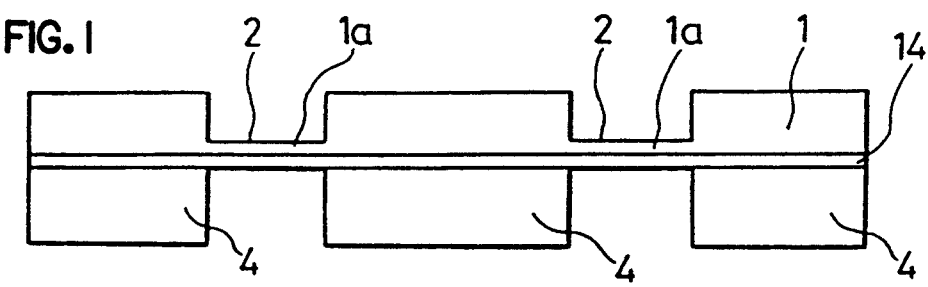
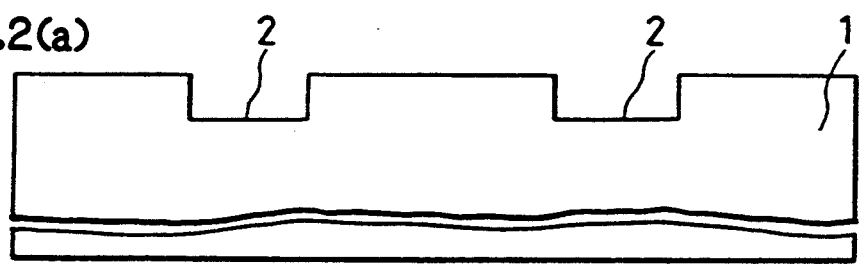
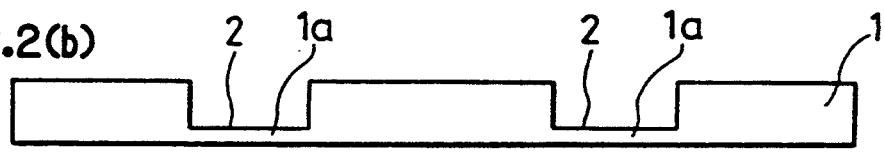
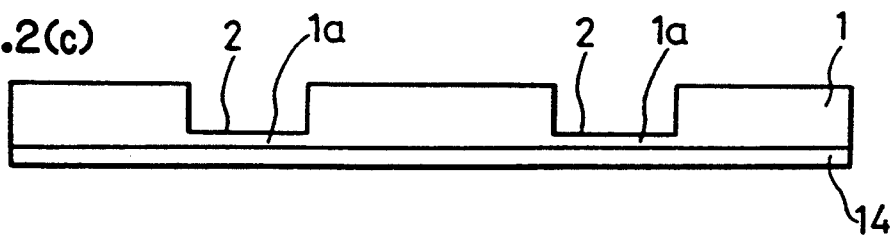
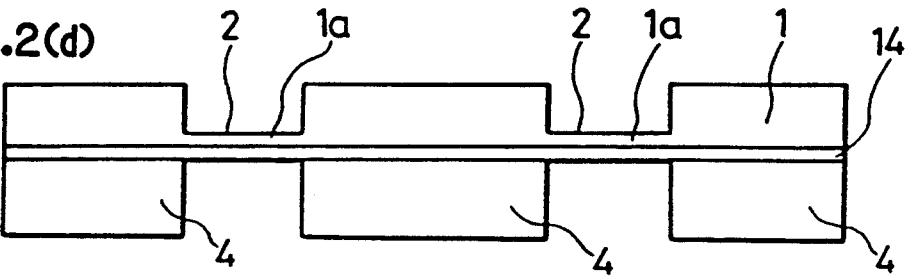

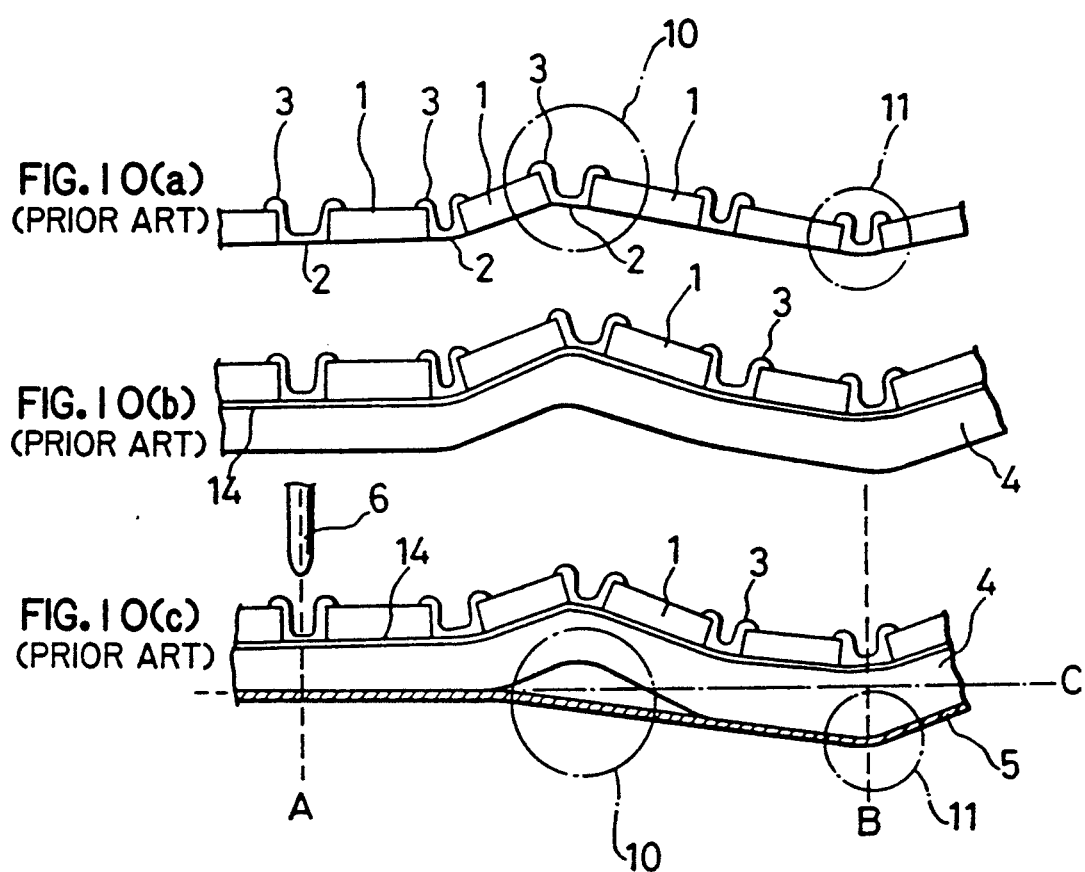

METHOD FOR PRODUCING SEMICONDUCTOR DEVICE

FIELD OF THE INVENTION

The present invention relates to a method for producing semiconductor chips and, more particularly, to improved dicing lines along which a semiconductor wafer is divided into chips.

BACKGROUND OF THE INVENTION

FIG. 8 is a cross-sectional view of a conventional GaAs semiconductor wafer before a dicing process. Semiconductor chips 1 are mechanically connected to each other by metal films 3 comprising gold or the like, so that the strength of the wafer comprising is increased. Each chip is about 40 to 50 microns thick and has an active element and a passive element on its main surface. The metal films 3 are formed by electroless plating. An Au layer 4 is disposed on the rear surface of the wafer through an intermediate feeding layer 14, so that heat is efficiently radiated from heat generating elements (not shown) on the semiconductor substrates. The Au layer 4 is generally called as a plated heat sink (hereafter referred to as PHS).

A method for producing the semiconductor wafer of FIG. 8 is illustrated in FIGS. 9(a)-9(e).

Initially, as illustrated in FIG. 9(a), a surface of the GaAs wafer 1 approximately 600 microns thick is partially etched away to form grooves 2 approximately 30 microns depth. The grooves 2 serve as dicing lines in a dicing process.

Then, as illustrated in FIG. 9(b), metal films 3 each having a thickness of 2 to 3 microns and comprising gold are formed in the grooves 2 by electroless plating. Thereafter, the GaAs wafer 1 is ground from the rear surface until the metal films 3 are exposed, resulting in a plurality of semiconductor chips 1 comprising the wafer and connected to each other by the metal films 3 as shown in FIG. 9(c).

Then, as illustrated in FIG. 9(d), a feeding layer 14 approximately several microns thick comprising gold or the like is formed over the rear surface of the wafer. Then, as illustrated in FIG. 9(e), a PHS layer 4 approximately 40 microns thick is formed on the feeding layer 14.

In the conventional method for producing semiconductor chips, before the formation of the PHS layer 4, the GaAs chips 1 are connected to each other by only the metal films 3, so that the strength of the whole wafer is poor in resisting stress applied in the production process, such as handling. Therefore, as illustrated in FIG. 10(a), the metal film 3 unfavorably rises (portion 10 in the figure) or sinks (portion 11 in the figure), whereby the wafer unfavorably curves i.e., becomes non-planar. Then, the feeding layer 14 and the plated heat sink 4 are formed on the rear surface of the curved wafer as illustrated in FIG. 10(b). When the wafer with the PHS layer 4 is cut by a blade 6 of a dicer (not shown) as illustrated in FIG. 10(c), if a depth of cut is adjusted to a line C at a point A, the blade 6 reaches only halfway in the PHS layer 4 at a point B due to the sinking portion 11, so that the dicing is not perfectly carried out. On the other hand, if the depth of cut is adjusted at the point B, a tape 5 applied to the PHS layer 4 is unfavorably cut at the point A, so that the dicing cannot be carried on, thereby reducing production yield.

In addition, since the metal film 3 and the PHS layer 4, both comprising a relatively soft metal like gold, are present beneath the dicing line 2, burrs 7 and 8 are produced after the dicing as illustrated in FIG. 11(a). When such a semiconductor chip is mounted on a package 17 and a wire 16 is connected to elements on the chip 1 as illustrated in FIG. 11(b), the wire 16 unfavorably contacts the burr 7, causing a short circuit. In addition, solder 18 is not evenly adhered to the PHS layer 4 because of the burr 8, so that the chip is not precisely die-bonded, causing a misassembly.

FIGS. 11(c) and 11(d) illustrate measuring characteristics of elements on the GaAs wafer 1. In FIG. 11(c), the semiconductor wafer of FIG. 10(b) is put on a stage 12 and air is evacuated through a hole 13 to fix the wafer onto the stage 12. However, because of the rising portion 10, the wafer cannot be fixed onto the stage 12. Even if the wafer is fixed to the stage 12 somehow, the GaAs wafer 1 inclines with respect to a horizontal plane D as illustrated in FIG. 11(d). In this case, an RF probe terminal 9 does not properly contact the elements on the chip 1, resulting in an inaccurate measurement.

Meanwhile, a method for dividing a semiconductor wafer into a plurality of chips by etching, a so-called pellet separation method, is employed in, for example, Japanese Published Patent Applications Nos. 62-122279, 2-148739, and 2-214127. In this method, although no burrs are produced, it is difficult to control the dimensions of each chip after the separation. In addition, because the chips after the etching process, are separated from each other, a rapid transition to the subsequent die-bonding process is prevented. This results in a poor production yield. In addition, it is not possible to selectively pick out non-defective chips which are tested before the separation. Therefore, this method is not suitable for processing and testing.

SUMMARY OF THE INVENTION

It is an object of the present invention to provide a method for producing semiconductor chips in which a semiconductor substrate with a PHS is flat and the depth of a cut made by a blade is easily set in a dicing process.

It is another object of the present invention to provide a method for producing semiconductor chips in which the semiconductor wafer is fixed to a wafer stage and an RF probe contacts the semiconductor substrate for measuring characteristics of elements on the wafer.

It is still another object of the present invention to provide a method for producing semiconductor chips in which production yield is improved and an adequate junction can be achieved in a die-bonding process.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, in a method for producing semiconductor chips, a plurality of grooves serving as dicing lines are formed in a surface of a wafer and the wafer is ground from the rear surface so as to leave bottoms of the grooves. Then, a feeding layer is formed on the rear surface of the wafer. Then, a PHS layer is formed on the feeding layer opposite to the wafer. Then, the semiconductor wafer is divided into a plurality of chips using a dicing tape and a dicing blade. Therefore, the strength of the wafer is increased because portions of the wafer and the feeding layer are present beneath the dicing lines. In addition, since the layers beneath the dicing lines are thin, burrs are reduced during the dicing.

BRIEF DESCRIPTION OF THE DRAWINGS

FIG. 1 is a cross-sectional view of a semiconductor wafer in accordance with a first embodiment of the present invention;

FIGS. 2(a)-2(d) are cross-sectional views of steps in a method for producing the semiconductor wafer of FIG. 1;

FIGS. 10(a)-10(c) are cross-sectional views for explaining problems in a dicing process in accordance with the prior art.

DETAILED DESCRIPTION OF THE PREFERRED EMBODIMENTS

Figure 3A:
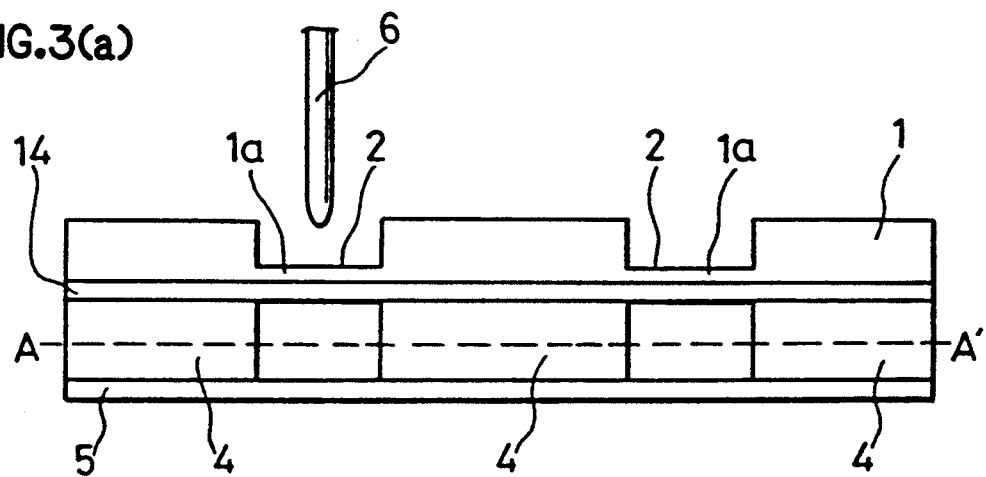
FIGS. 3(a)-3(b) are cross-sectional views of the semiconductor wafer of FIG. 1 in a dicing process.
Figure 3B:
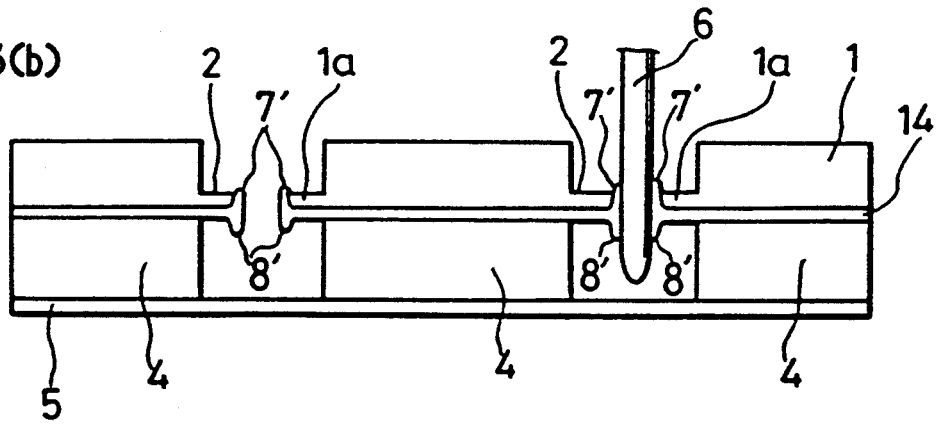

FIG. 1 is a cross-sectional view of a semiconductor wafer in accordance with a first embodiment of the present invention. In FIG. 1, reference numeral 1a designates a portion of the GaAs wafer 1 remaining beneath the dicing line 2. PHS layers 4 are opposite to the wafer 1 with the feeding layer 14 between the wafer 1 and PHS layers 4.

A method for producing the semiconductor wafer of FIG. 1 is illustrated in FIGS. 2(a)-2(d).

Initially, as illustrated in FIG. 2(a), a surface of the GaAs wafer 1, which is approximately 600 microns thick, is partially chemically etched to form grooves (dicing lines) 2 each having a depth of 10 to 15 microns.

Then, as illustrated in FIG. 2(b), the opposite surface of the wafer 1 is ground using a lathe or the like to reduce the thickness of the wafer 1 to approximately 30 microns. At this time, a portion 1a of the wafer 1 remaining beneath the groove 2 is 10 to 15 microns thick.

Then, as illustrated in FIG. 2(c), a feeding layer 14 several microns thick is formed over the rear surface of the wafer 1 by electroless plating using gold. Then, as illustrated in FIG. 2(d), PHS layers 4 are selectively formed on the feeding layer 14 except for regions beneath the grooves 2 using a photoresist (not shown) as a mask. Each PHS layer 4 is 40 to 50 microns thick.

According to the first embodiment of the present invention, when the GaAs wafer 1 is ground from the rear surface, the portions 1a which are 10 to 15 microns thick are left beneath the dicing lines 2 and then the feeding layer 14 is formed on the rear surface of the wafer. Since the portions 1a of the wafer and the feeding layer 14 are present beneath the dicing lines 2, the strength of the whole wafer is increased and the wafer is not bent like the conventional wafer even if a stress is applied in handling process or the like.

FIG. 3(a) shows the semiconductor wafer of FIG. 1(d) in a dicing process. A dicing tape 5 is applied to the PHS layers 4. If a depth of cut by a blade 6 is adjusted to a line A-A' considering generation of burrs of the feeding layer 14, the same depth of cut is obtained through all dicing lines 2.

In addition, since the feeding layer 14 is only several microns thick, burrs 7' and 8' are small that they never protrude from the upper and lower surfaces of the chip. Therefore, when the chip is mounted on a package, solder is evenly adhered to the PHS layer 4, resulting in accurate die bonding. In addition, short circuits do not occur when the chip is connected to an external device with a wire.

Figure 4A:
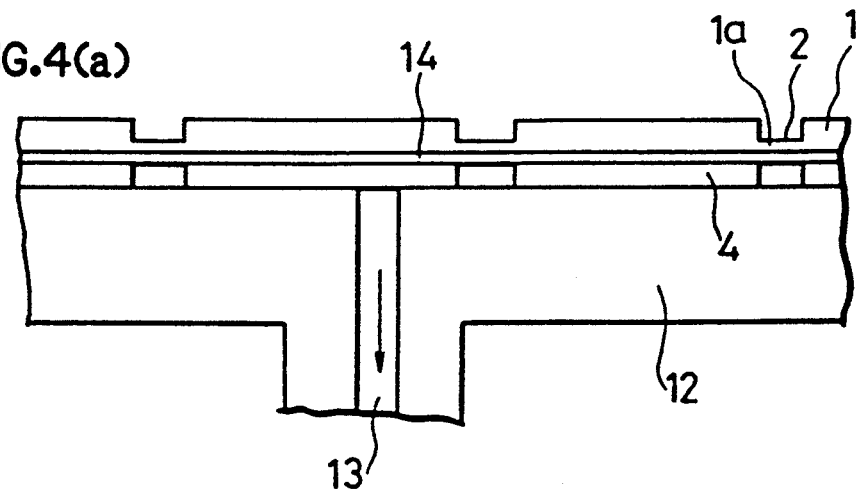
FIGS. 4(a)-4(b) are cross-sectional views of the semiconductor wafer of FIG. 1 during measuring of characteristics.
Figure 4B:
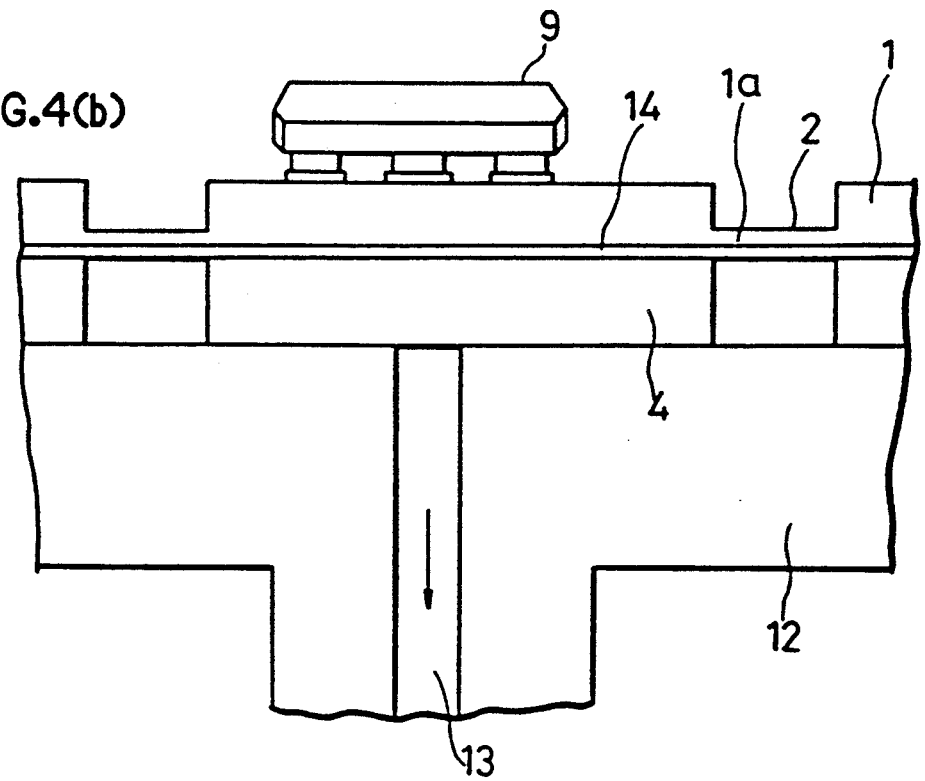

As illustrated in FIG. 4(a), when the semiconductor wafer is put on a stage 12 and fixed to the stage by evacuating air through a hole 13, since the wafer 1 is flat, it is mounted firmly and horizontally. Therefore, an RF probe 9 reliably contacts the chip as shown in FIG. 4(b) and the test is carried out in a good condition.

Figure 5:
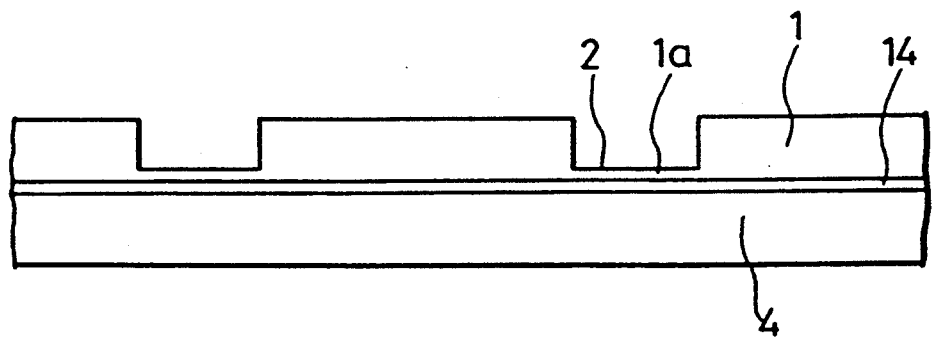
FIG. 5 is a cross-sectional view of a semiconductor wafer in accordance with a second embodiment of the present invention.

FIG. 5 is a cross-sectional view of a semiconductor wafer in accordance with a second embodiment of the present invention, in which a PHS layer 4 is formed on the entire rear surface of the wafer 1 through a feeding layer 14. Also in this structure, curvature of the wafer before dicing is prevented. In addition, since the patterning of the PHS layer 4 is omitted, the production process is simplified. However, burrs of the PHS layer 4 are produced in the dicing process, that affect the subsequent die-bonding process.

Figure 6:
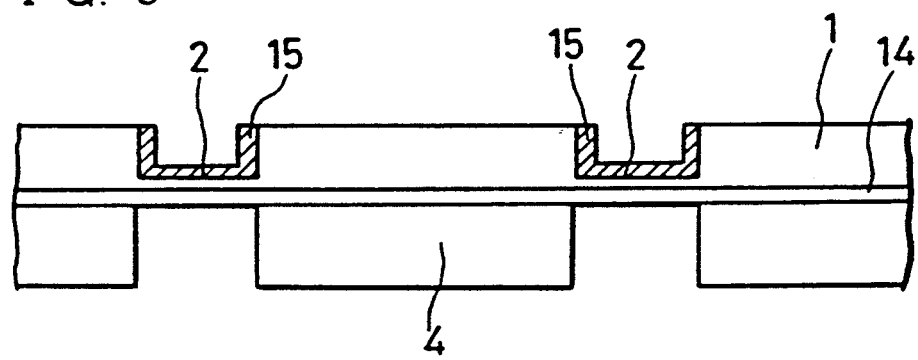
FIG. 6 is a cross-sectional view of a semiconductor wafer in accordance with a third embodiment of the present invention.

FIG. 6 is a cross-sectional view of a semiconductor wafer in accordance with a third embodiment of the present invention. In this embodiment, WSi, SiO$_2$ or the like is selectively deposited on the dicing lines 2 to a thickness of several thousands of angstroms by sputtering to form reinforcing films 15 which increase the strength of the wafer. These reinforcing films 15 are formed after the formation of the dicing lines 2 shown in FIG. 2(a), i.e., before the grinding of the wafer. Therefore, the strength of the wafer is further increased to resist stress applied in the subsequent process steps. Preferably, the reinforcing film comprises a brittle material, such as WSi or SiO$_2$.

Figure 7:
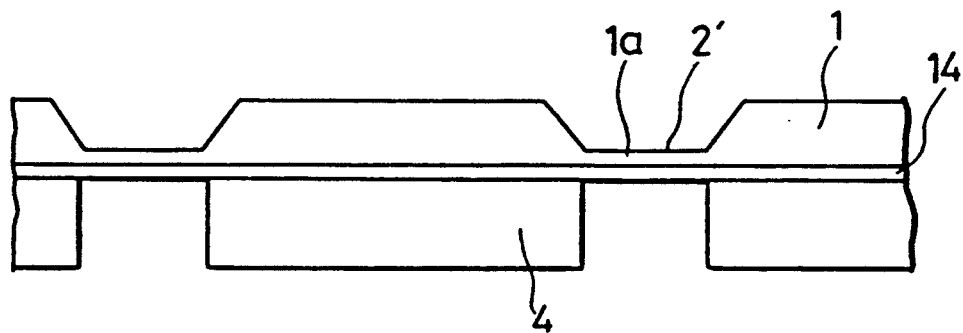
FIG. 7 is a cross-sectional view of a semiconductor wafer in accordance with a fourth embodiment of the present invention.
Figure 8:
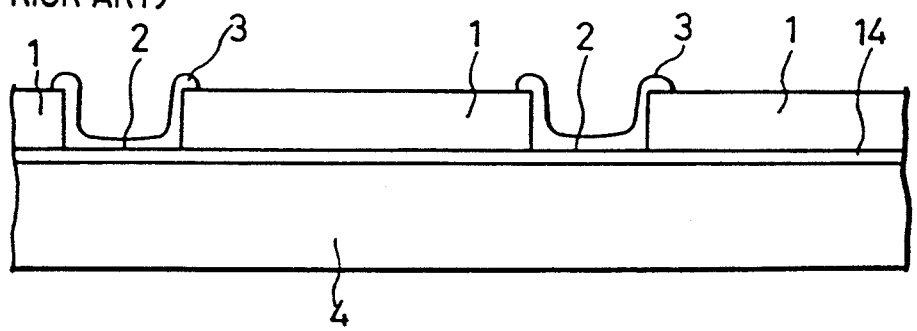
FIG. 8 is a cross-sectional view of a semiconductor wafer in accordance with the prior art.
Figure 9A:
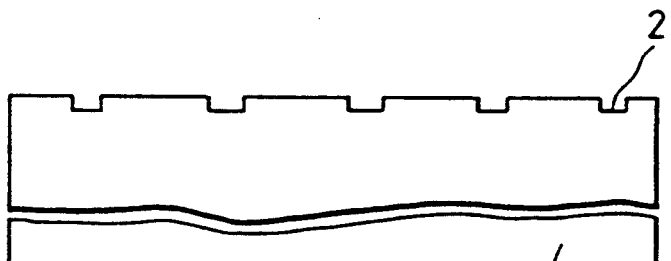
FIGS. 9(a)-9(e) are cross-sectional view of steps in a method for producing the semiconductor wafer of FIG. 8.
Figure 9B:
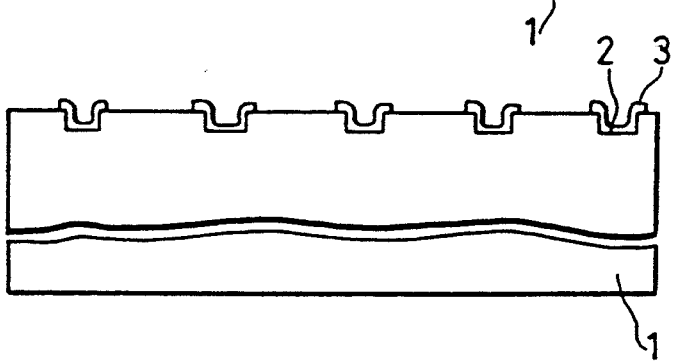
Figure 9C:
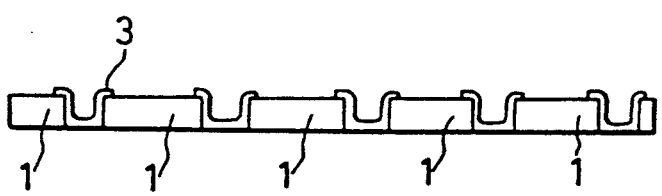
Figure 9D:
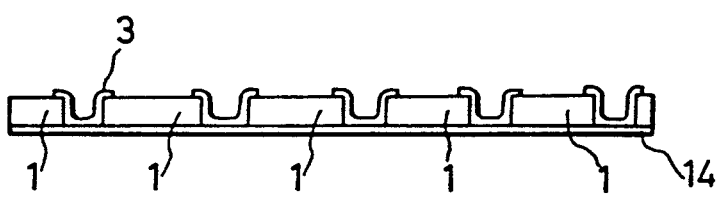
Figure 9E:
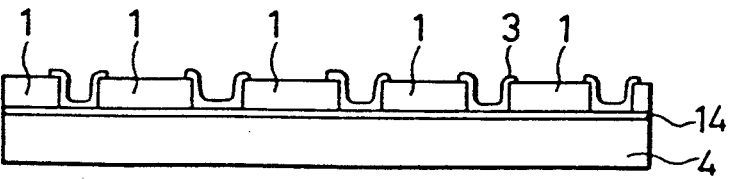
Figures 11A, 11B, 11C, 11D:
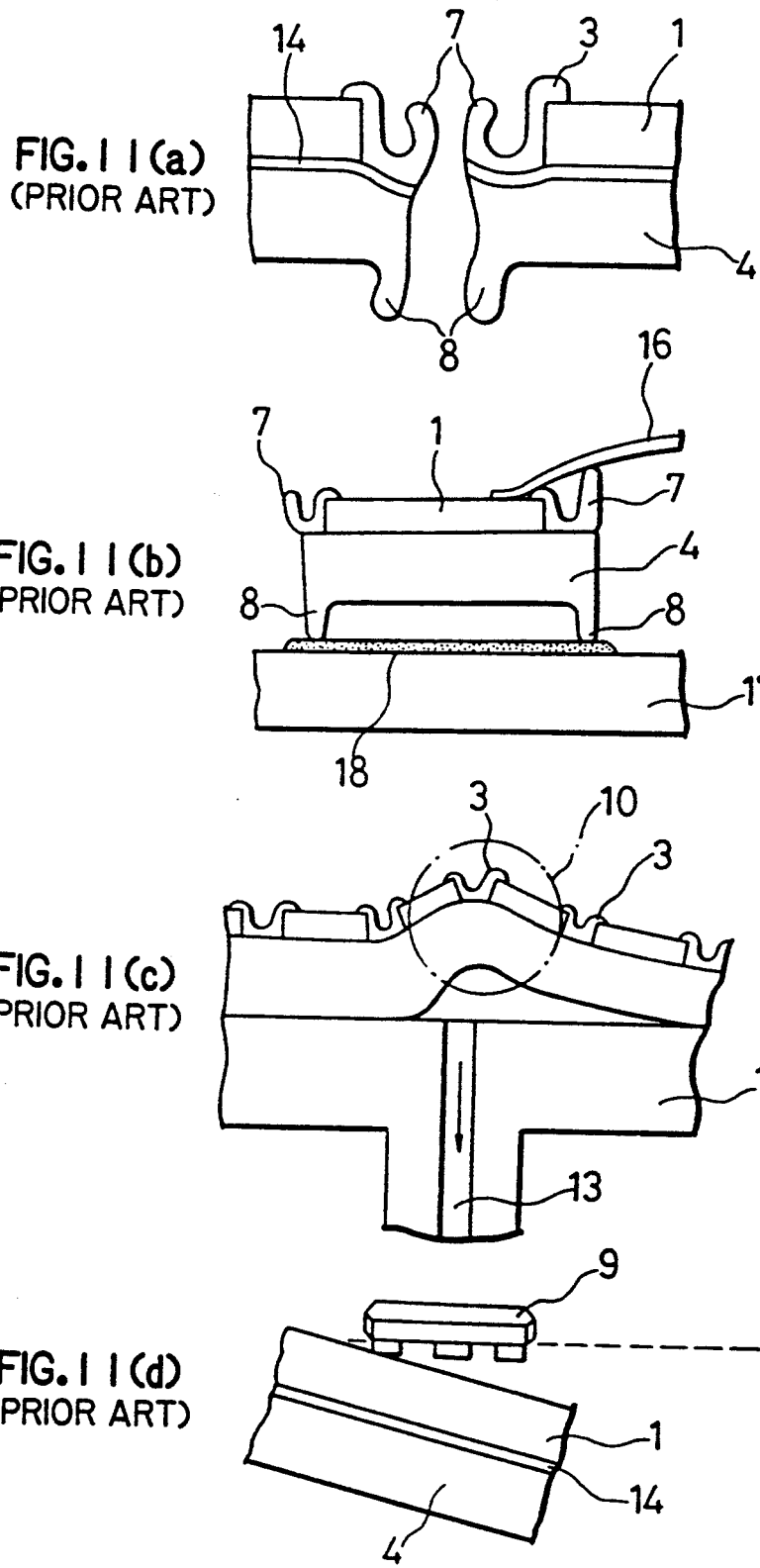
FIGS. 11(a)-11(d) are cross-sectional views for explaining problems in a die-bonding process and a process of measuring characteristics in accordance with the prior art.

FIG. 7 is a cross-sectional view of a semiconductor wafer in accordance with a fourth embodiment of the present invention. In this fourth embodiment, dicing lines 2' are formed by isotropic etching so that the sidewall of each chip 1 is an obtuse angle. Therefore, when the semiconductor chip is picked up with tweezers or the like after dicing, breakage of the chip is prevented, increasing production yield and reliablity.

While in the above-illustrated embodiment GaAs is used for the wafer 1, other semiconductor materials, such as InP, may be used.

As is evident from the foregoing description, in a method for producing semiconductor chips according to the present invention, a plurality of grooves serving as dicing lines are formed in a surface of a wafer and the wafer is ground from the rear surface so as to leave portions of the wafer in place opposite the grooves. Then, a feeding layer is formed on the ground rear surface of the wafer and a PHS layer is formed on the feeding layer. The, the semiconductor wafer is divided into a plurality of chips using a dicing tape and a dicing blade. Therefore, the strength of the wafer is increased because portions of the wafer remain at the dicing lines, preventing curvature of the wafer. Therefore, the depth of cut is easily set in the dicing process. In addition, characteristics of elements on the wafer are measured precisely.

In addition, a plurality of PHS layers are selectively formed on the feeding layer except at regions opposite the dicing lines. Therefore, only the thin portions of the wafer and the feeding layer are present beneath the dicing lines, burrs produced during dicing are reduced, and an adequate junction is achieved in the subsequent die-bonding process, resulting in high production yield.

What is claimed is:

1. A method for producing semiconductor chips comprising:

forming grooves serving as dicing lines in a front surface of a semiconductor wafer;

depositing one of WSi and $SiO_2$ as a reinforcing layer in the grooves;

grinding said semiconductor wafer from the rear surface to a prescribed thickness, leaving portions of the wafer in place opposite the dicing lines;

forming a metallic feeding layer on the ground rear surface of the wafer;

forming a metal layer for heat radiation on said feeding layer;

applying a dicing tape to said metal layer; and cutting through said wafer and said feeding layer along said dicing lines with a dicing blade to produce a plurality of semiconductor chips.

2. The method of claim 1 including forming said metal layer for heat radiation selectively on said feeding layer and not opposite the dicing lines.

3. The method of claim 1 including forming said metal layer for heat radiation over all of the feeding layer.

4. The method of claim 1 including measuring electrical characteristics of a circuit on the front surface of said wafer after forming said metal layer.

5. The method of claim 1 including forming the grooves by chemical etching.

6. The method of claim 5 wherein each groove has a reverse-trapezoid cross section.

* * * * *